(12) United States Patent
Hirayama et al.

(10) Patent No.: US 10,856,461 B2
(45) Date of Patent: Dec. 1, 2020

(54) WORK SYSTEM

(71) Applicant: FUJI CORPORATION, Chiryu (JP)

(72) Inventors: Hirotaka Hirayama, Toyohashi (JP); Yusuke Nara, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/603,371

(22) PCT Filed: Apr. 28, 2017

(86) PCT No.: PCT/JP2017/016996
§ 371 (c)(1),
(2) Date: Oct. 7, 2019

(87) PCT Pub. No.: WO2018/198333
PCT Pub. Date: Nov. 1, 2018

(65) Prior Publication Data
US 2020/0037480 A1 Jan. 30, 2020

(51) Int. Cl.
*H05K 13/02* (2006.01)
*H05K 13/00* (2006.01)
(Continued)

(52) U.S. Cl.
CPC .......... *H05K 13/086* (2018.08); *H05K 13/02* (2013.01); *H05K 13/0417* (2013.01); *H05K 2203/0147* (2013.01)

(58) Field of Classification Search
None
See application file for complete search history.

(56) References Cited

U.S. PATENT DOCUMENTS

| 4,969,256 A * | 11/1990 | Shimizu | H05K 13/02 29/431 |
| 9,814,170 B2 * | 11/2017 | Gieskes | H05K 13/0413 |
| 2018/0242485 A1 | 8/2018 | Kondo et al. | |

FOREIGN PATENT DOCUMENTS

| CN | 1505467 A | 6/2004 |
| EP | 3 107 365 A1 | 12/2016 |

(Continued)

OTHER PUBLICATIONS

International Search Report dated Aug. 1, 2017 in PCT/JP2017/016996 filed on Apr. 28, 2017.

*Primary Examiner* — Kavel Singh
(74) *Attorney, Agent, or Firm* — Oblon, McClelland, Maier & Neustadt, L.L.P.

(57) ABSTRACT

A work system includes multiple work devices aligned along a board conveyance line, a replenishing device having a sensor for detecting presence or absence of an interfering object and configured to move in parallel with the board conveyance line while detecting the presence or absence of the interfering object by the sensor to replenish necessary members to the multiple work devices, and a draw-out device configured to draw out at least one of the multiple work devices in a direction orthogonal to a direction along the board conveyance line. When a draw-out request for the work device is made, the replenishing device performs an automatic draw-out process of moving to a position in which a draw-out position of the work device to be pulled forward is included within a detection range of the sensor, so as to determine whether the interfering object is detected by the sensor.

5 Claims, 8 Drawing Sheets

(51) Int. Cl.
*H05K 13/08* (2006.01)
*H05K 13/04* (2006.01)

(56) References Cited

FOREIGN PATENT DOCUMENTS

JP  2004-104075 A  4/2004
WO  WO 2017/033268 A1  3/2017

* cited by examiner

WORK SYSTEM

TECHNICAL FIELD

The present description discloses a work system.

BACKGROUND ART

Conventionally, a work system including multiple work devices for performing work on a circuit board has been proposed (for example, see Patent Literature 1). The multiple work devices are arranged on a system base in line in the board conveyance direction, and are configured to be movable relative to the system base along a device track extending in a direction crossing the board conveyance direction (front-rear direction). With such a work system, by pulling the work device forward to the front side with respect to the adjacent work device (draw-out state), it is possible to easily perform works such as maintenance and adjustment.

PATENT LITERATURE

Patent Literature 1: JP-A-2004-104075

BRIEF SUMMARY

Technical Problem

In the above-mentioned work system, it is conceivable that the draw-out of the working device is performed by the human power of an operator, or by the driving force of a driving device by the operator operating an operation panel and giving commands. However, such an approach is inefficient because it takes a long waiting time from the time the operator arrives at the site until the work device is actually pulled forward and the operator can start the work required for the work device. On the other hand, it is conceivable to automatically draw out the work device at a necessary timing, but it is necessary to secure sufficient safety so that the work device does not come into contact with the operator during the draw-out of the work device.

A main object of the present disclosure is to enable automatic draw-out of a work device while securing safety.

Solution to Problem

The present disclosure employs the following means in order to achieve the above-mentioned main object.

A work system of the present disclosure is a work system for performing a predetermined work on a board conveyed along a board conveyance line, the work system comprising: multiple work devices aligned along the board conveyance line; a replenishing device, having a sensor for detecting presence or absence of an interfering object, which is configured to move in parallel with the board conveyance line, while detecting the presence or absence of the interfering object by the sensor, so as to replenish necessary members to the multiple work devices; and a draw-out device configured to draw out at least one of the multiple work devices in a direction orthogonal to a direction along the board conveyance line, wherein, when a draw-out request for the work device is made, the replenishing device performs an automatic draw-out process of moving to a position, in which a draw-out position of the work device to be pulled forward is included within a detection range of the sensor, so as to determine whether the interfering object is detected by the sensor, and directly or indirectly outputting a signal to the draw-out device so that the work device to be pulled forward is drawn when the interfering object is not detected.

In the work system of the present disclosure, the work device can be drawn before or immediately after the operator arrives at the site by executing the automatic draw-out process. As a result, the operator can immediately start the necessary work on the drawn work device. In addition, since the replenishing device checks whether there is an interfering object at the draw-out position of the work device prior to the draw-out of the work device to be pulled forward, it is possible to sufficiently secure safety. Further, since the presence or absence of an interfering object is checked using a sensor attached to a replenishing device for replenishing a member necessary for a work device, it is unnecessary to provide a dedicated sensor.

DESCRIPTION OF EMBODIMENTS

Next, Description of Embodiments of the present disclosure will be described with reference to the drawings.

Figure 1:
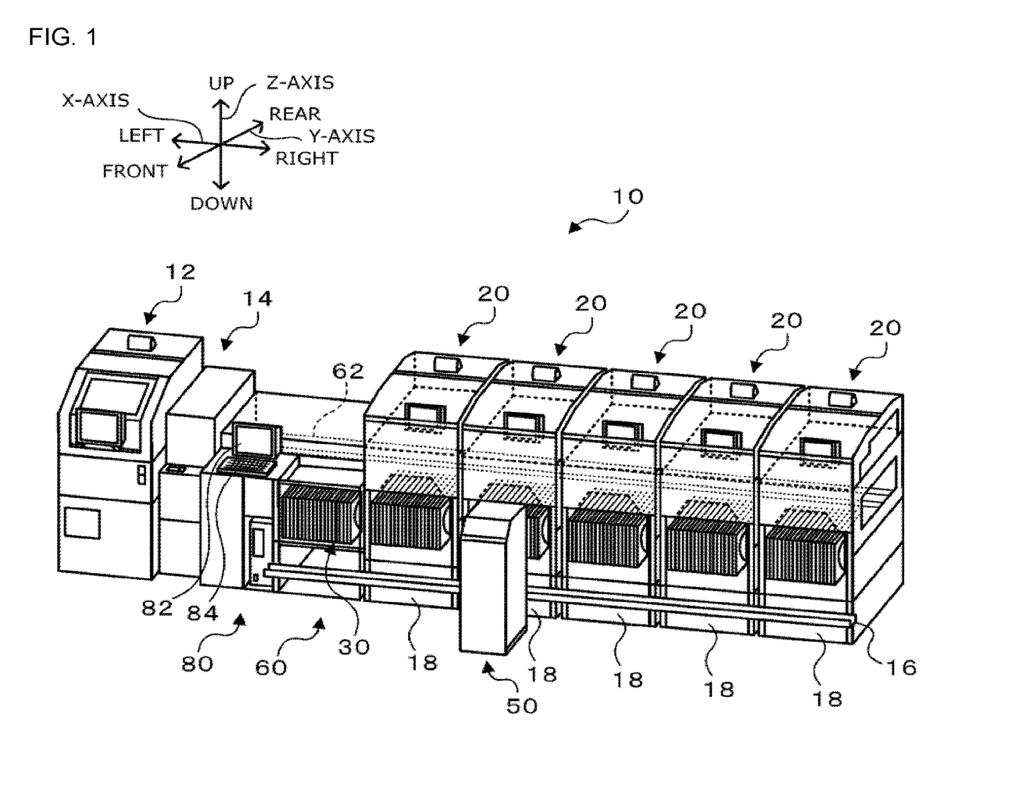
FIG. 1 is a diagram showing a schematic configuration of component mounting system 10 according to the present embodiment.
Figure 2:
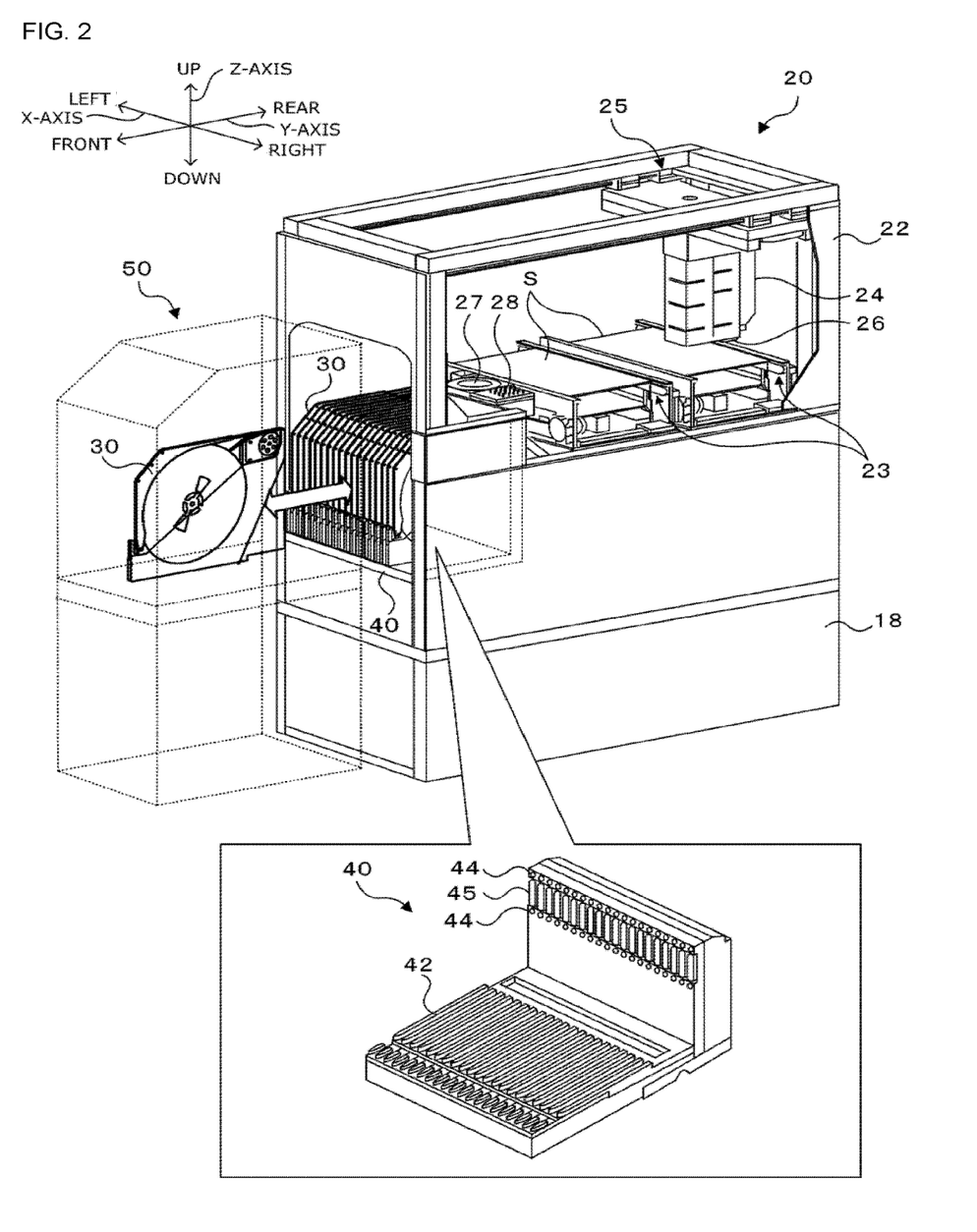
FIG. 2 is a diagram showing a schematic configuration of component mounting machine 20.
Figure 3:
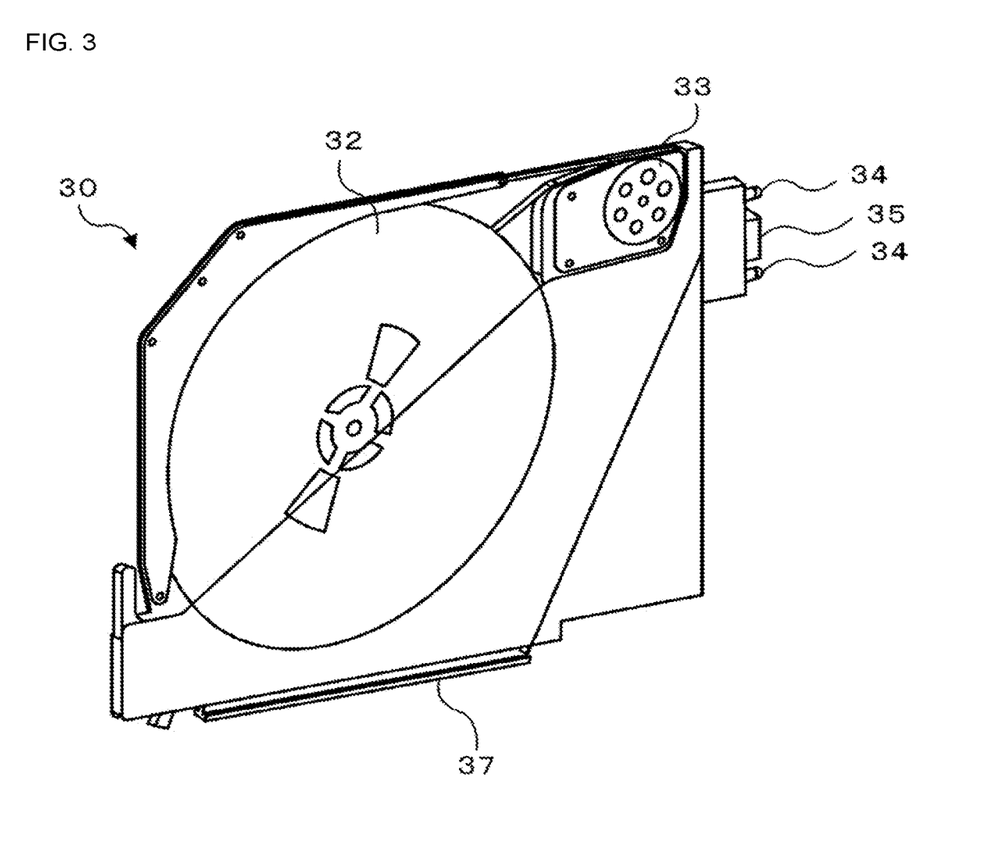
FIG. 3 is a diagram showing a schematic configuration of feeder 30.
Figure 4:
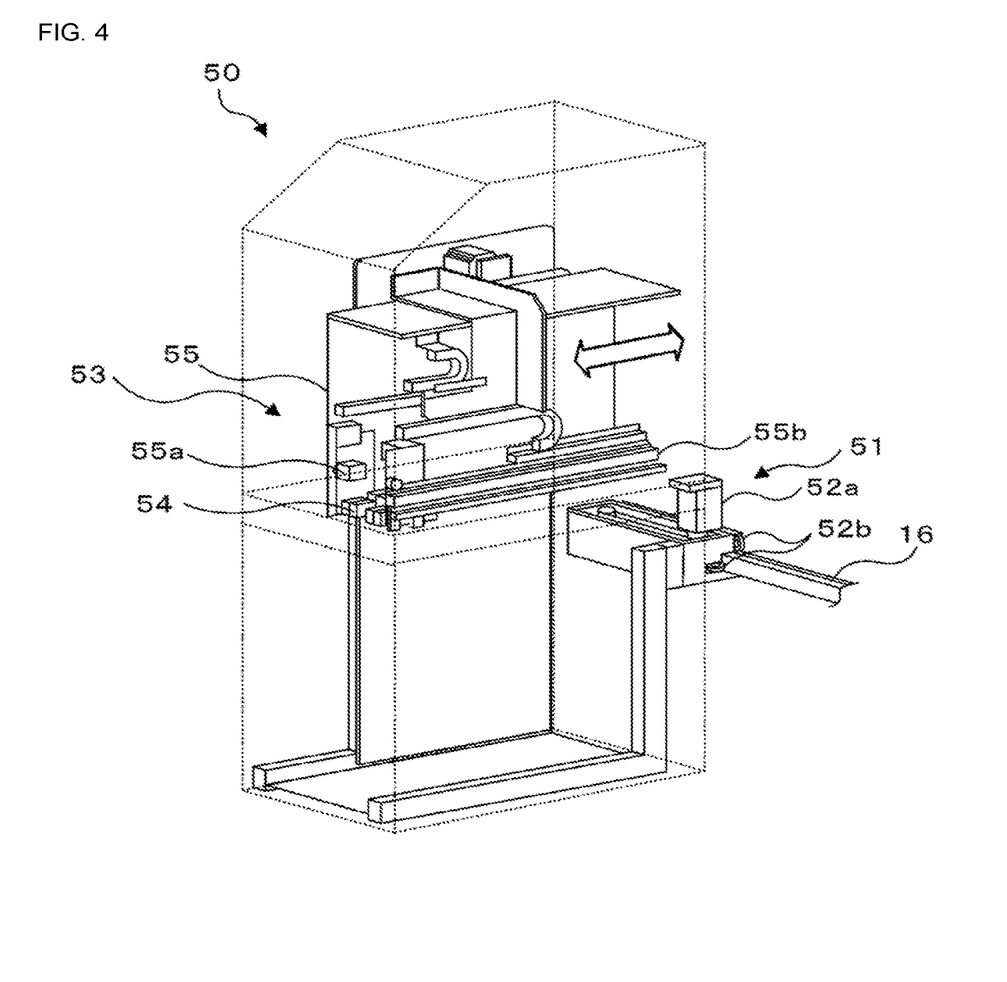
FIG. 4 is a diagram showing a schematic configuration of loader 50.
Figure 5:
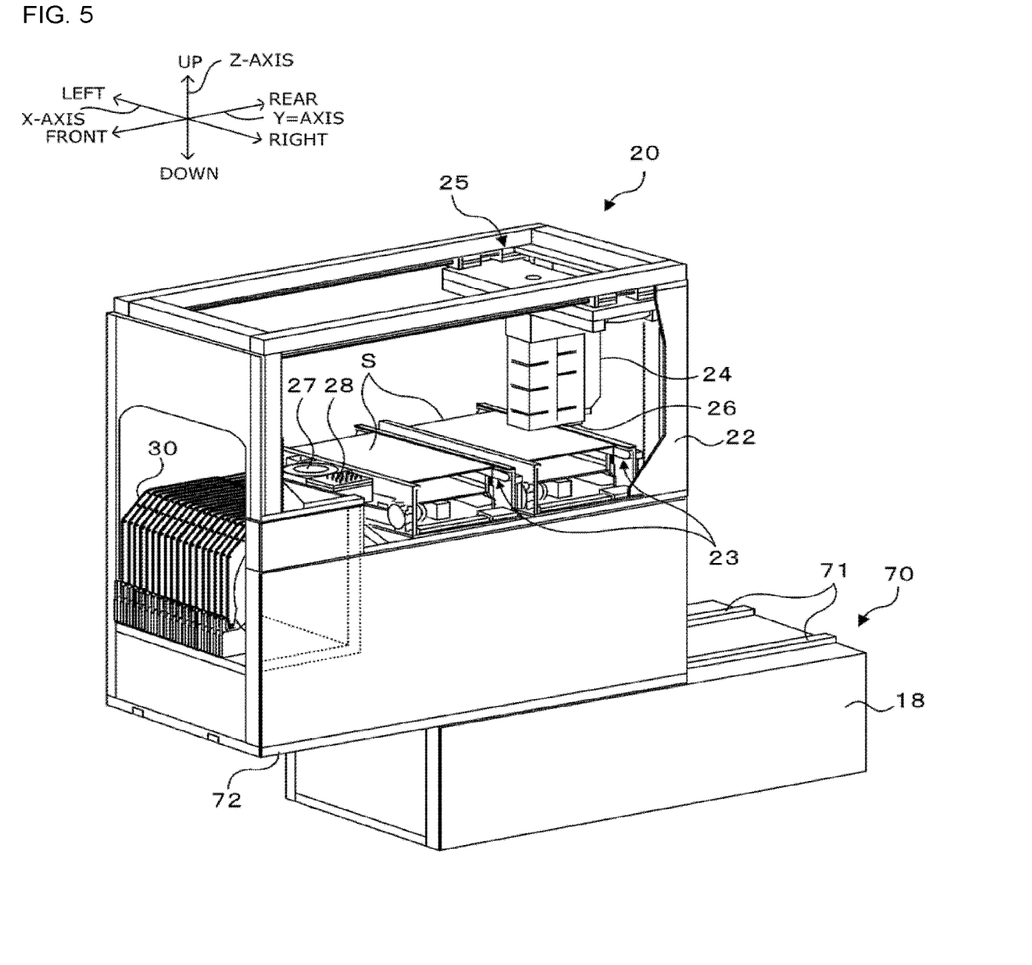
FIG. 5 is a diagram showing a schematic configuration of draw-out device 70.
Figure 6:
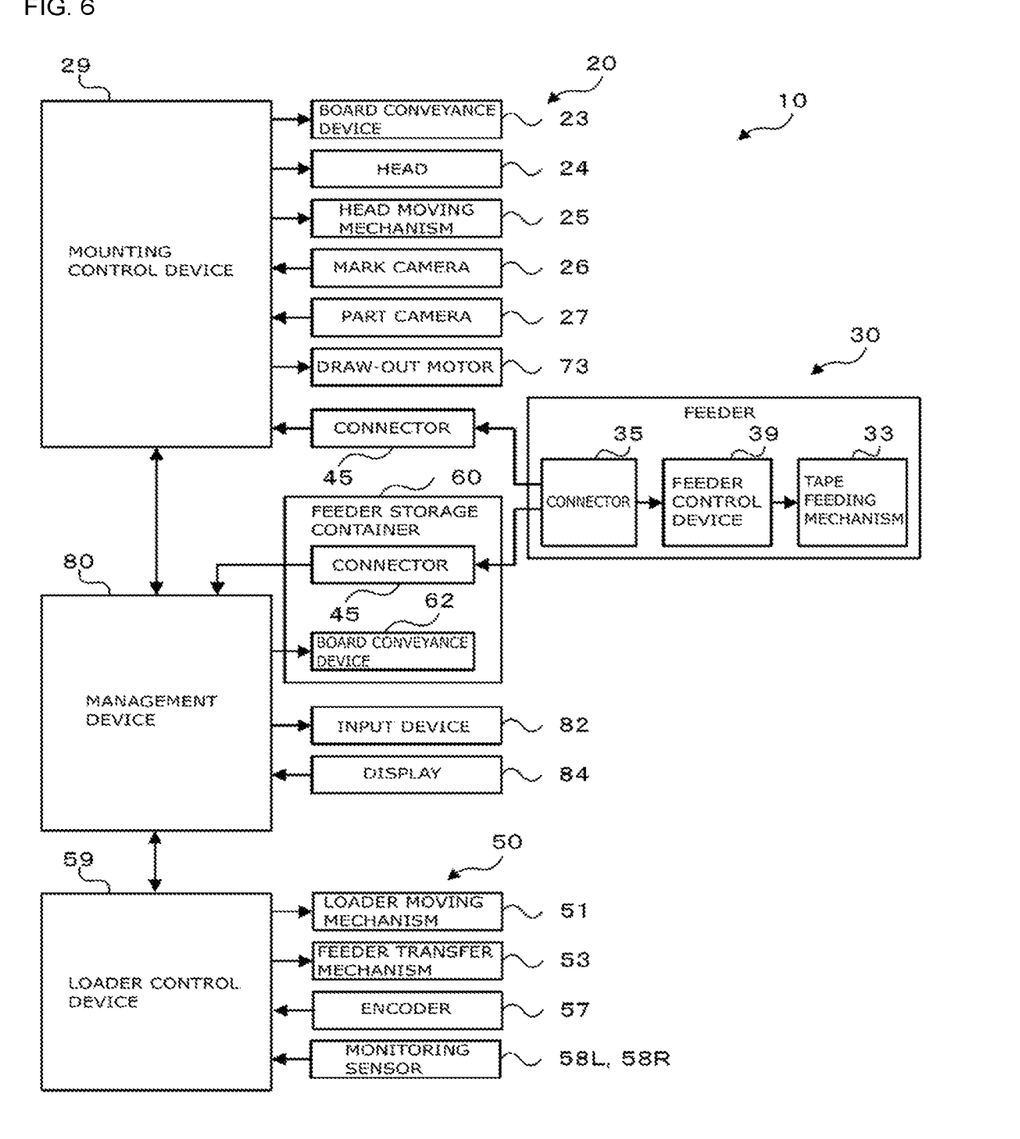
FIG. 6 is an explanatory diagram showing an electrical connection among mounting control device 29, loader control device 59, and management device 80.

FIG. 1 is a diagram showing a schematic configuration of component mounting system 10 of the present embodiment. FIG. 2 is a diagram showing a schematic configuration of component mounting machine 20. FIG. 3 is a diagram showing a schematic configuration of feeder 30. FIG. 4 is a diagram showing a schematic configuration of loader 50. FIG. 5 is a diagram showing a schematic configuration of draw-out device 70. FIG. 6 is an explanatory diagram showing an electrical connection relationship among mounting control device 29, loader control device 59, and management device 80. In FIGS. 1 and 2, the left-right direction is the X-axis direction, the front-rear direction is the Y-axis direction, and the up-down direction is the Z-axis direction.

As shown in FIG. 1, component mounting system 10 includes printer 12, printing inspector 14, multiple component mounting machines 20, a mounting inspector (not shown), loader 50, feeder storage container 60, draw-out device 70 (see FIG. 5), and management device 80. Printer 12 prints solder on board S. Printing inspector 14 inspects the state of the solder printed by printer 12. Component mounting machine 20 is mounted on base 18 aligned along the conveyance direction (X-direction) of board S, and mounts the component supplied from feeder 30 on board S. The mounting inspector inspects a mounting state of the component mounted on component mounting machine 20. Loader 50 replenishes necessary feeders 30 to multiple component mounting machines 20, and collects used feeders 30 from component mounting machines 20. Feeder storage container 60 is capable of storing feeder 30 to be used in component mounting machine 20 and the used feeder 30. Draw-out device 70 pulls component mounting machine 20 forward with respect to base 18 (in a direction orthogonal to the conveyance direction of board S, that is, in the Y-direction) so that the operator can easily perform the work in housing 22 at the time of occurrence of changeover or occurrence of an error. Management device 80 manages the entire system. Printer 12, printing inspector 14, and multiple component mounting machines 20 are arranged side by side in the conveyance direction of board S in this order to constitute a production line. Feeder storage container 60 is incorporated in the production line of component mounting system 10, and is installed between component mounting machine 20 located on the most upstream side in the conveyance direction of the board among multiple component mounting machines 20 and printing inspector 14. That is, feeder storage container 60 is installed upstream of component mounting machine 20 on the most upstream side.

As shown in FIG. 2, component mounting machine 20 includes board conveyance device 23 for conveying board S from left to right, head 24 having a suction nozzle for picking up the component supplied by feeder 30, head moving mechanism 25 for moving head 24 in the front-rear direction and the left-right direction (XY-directions), and mounting control device 29 (see FIG. 6) for controlling the entire device. Component mounting machine 20 further includes mark camera 26, part camera 27, nozzle station 28, and the like. Mark camera 26 is attached to head 24 and captures an image of a reference mark attached to board S from above. Part camera 27 is installed between feeder 30 and board conveyance device 23, and captures an image of the component from below when the suction nozzle, which has picked up the component, passes above part camera 27. Nozzle station 28 accommodates multiple types of suction nozzles so as to be exchangeable according to the types of components to be picked up. Mounting control device 29 is composed of a well-known CPU, ROM, RAM, and the like. Image signals from mark camera 26 and part camera 27 are input to mounting control device 29. Mounting control device 29 recognizes the position of board S by, for example, processing the image of board S captured by mark camera 26 and recognizing the position of a board mark (not shown) attached to board S. In addition, mounting control device 29 determines whether a component is picked up by the suction nozzle based on the image captured by part camera 27 (presence or absence of pick-up error), and determines the pick-up position and the pick-up orientation of the component. Mounting control device 29 outputs drive signals to board conveyance device 23, head 24, head moving mechanism 25, and the like.

Feeder 30 is a tape feeder attached to component mounting machine 20. As shown in FIG. 3, feeder 30 includes tape reel 32, tape feeding mechanism 33, connector 35, rail member 37, and feeder control device 39 (see FIG. 6). A tape is wound around tape reel 32. The tape has multiple recessed portions formed at intervals, such as along its longitudinal direction. Each recessed portion accommodates a component. These components are protected by a film covering the surface of the tape. Tape feeding mechanism 33 feeds the tape from tape reel 32. Feeder 30 drives tape feeding mechanism 33 to feed the tape rearward by a predetermined amount, thereby sequentially feeding the components accommodated in the tape to the component supply position. The component accommodated in the tape is exposed at the component supply position by peeling off the film before the component supply position, and is picked up by the suction nozzle. Connector 35 has two positioning pins 34 projecting in the mounting direction. Rail member 37 is provided at the lower end of feeder 30 and extends in the mounting direction. Feeder control device 39 includes a well-known CPU, ROM, RAM, and the like, and outputs a drive signal to tape feeding mechanism 33. Feeder control device 39 can communicate with a control section (such as mounting control device 29 or management device 80) to which feeder 30 is attached via connector 35.

As shown in FIG. 2, feeder 30 is detachably attached to feeder table 40 provided in front of component mounting machine 20. Multiple feeder tables 40 are arranged in the X-direction, and the feeders 30 are attached so as to be aligned in the X-direction. Feeder table 40 is an L-shaped table in a side view, and includes slot 42, two positioning holes 44, and connector 45. Rail member 37 of feeder 30 is inserted into slot 42. Two positioning pins 34 of feeder 30 are inserted into two positioning holes 44, and feeder 30 is positioned on feeder table 40. Connector 45 is provided between two positioning holes 44, and is connected to connector 35 of feeder 30.

Loader 50 is movable along X-axis rail 16 provided on the front face of multiple component mounting machines 20 and the front face of feeder storage container 60 in parallel with the board conveyance direction (X-axis direction). In FIGS. 2 and 5, X-axis rail 16 is not shown.

As shown in FIG. 4, loader 50 includes loader moving mechanism 51, feeder transfer mechanism 53, encoder 57 (see FIG. 6), left and right monitoring sensors 58L and 58R (see FIG. 6), and loader control device 59 (see FIG. 6). Loader moving mechanism 51 moves loader 50 along X-axis rail 16, and includes X-axis motor 52a such as a servomotor for driving a driving belt, and guide roller 52b for guiding the movement of loader 50 along X-axis rail 16. Feeder transfer mechanism 53 transfers feeder 30 to component mounting machine 20 or feeder storage container 60, and includes clamp section 54 for clamping feeder 30 and Y-axis slider 55 for moving clamp section 54 along Y-axis guide rail 55b. Y-axis slider 55 includes Y-axis motor 55a, and moves clamp section 54 in the front-rear direction (Y-axis direction) by driving Y-axis motor 55a. Encoder 57 detects the movement position of loader 50 in the X-direction. Monitoring sensors 58L and 58R monitor the presence or absence of an interfering object (operator), and are configured by, for example, infrared sensors. Left monitoring sensor 58L is attached to the left side of loader 50 (the side opposite to the conveyance direction of board S), and has detection region AL capable of detecting an interfering object mainly on the left of loader 50. Right monitoring sensor 58R is attached to the right side of loader 50 (on the same side as the conveyance direction of board S), and has detection region AR capable of detecting an interfering object mainly on the right of loader 50. Loader control device 59 includes a well-known CPU, ROM, RAM, and the like, receives detection signals from encoder 57 and monitoring sensors 58L and 58R, and outputs drive signals to loader moving mechanism 51 (X-axis motor 52a) and feeder transfer mechanism 53 (clamp section 54 and Y-axis motor 55a).

When attaching feeder 30 in loader 50 to component mounting machine 20, loader control device 59 first causes X-axis motor 52a to move loader 50 to a position facing component mounting machine 20 to which feeder 30 is to be attached. Next, loader control device 59 causes clamp section 54 to clamp feeder 30. Then, loader control device 59 causes Y-axis motor 55a to move Y-axis slider 55 rearward (on component mounting machine 20 side), inserts rail member 37 of feeder 30 into slot 42 of feeder table 40, and causes clamp section 54 to release the clamp of feeder 30. As a result, feeder 30 is attached to feeder table 40 of component mounting machine 20.

When removing feeder 30 from component mounting machine 20 and collecting it in loader 50, loader control device 59 first causes X-axis motor 52a to move loader 50 to a position facing component mounting machine 20 to which feeder 30 to be collected is attached. Next, loader control device 59 clamps feeder 30 attached to feeder table 40 with clamp section 54. Then, loader control device 59 causes Y-axis motor 55a to move Y-axis slider 55 forward (toward loader 50 side). As a result, feeder 30 is removed from feeder table 40 and collected in loader 50.

Feeder storage container 60 is provided with multiple feeder tables 40 having the same configuration as feeder tables 40 provided in component mounting machines 20 in order to accommodate multiple feeders 30. Feeder table 40 of feeder storage container 60 is provided at the same height (position in the Z-direction) as feeder table 40 of component mounting machine 20. Therefore, loader 50 can attach and detach feeder 30 to and from feeder table 40 of feeder storage container 60 in the same operation as attaching and detaching feeder 30 to and from feeder table 40 of component mounting machine 20 at the position facing feeder storage container 60.

Board conveyance device 62 for conveying board S in the X-direction is provided at the back of feeder storage container 60. Board conveyance device 62 has the same positions in the front-rear direction and the up-down direction as those of the board conveyance device (not shown) of printing inspector 14 and board conveyance device 23 of the adjacent component mounting machine 20. For this reason, board conveyance device 62 can convey board S received from the board conveyance device of printing inspector 14 and deliver board S to board conveyance device 23 of adjacent component mounting machine 20.

Draw-out device 70 includes a pair of left and right Y-axis guide rails 71 provided on the upper portion of base 18 and extending in the front-rear direction (Y-direction), and Y-axis slider 72 provided on the lower portion of component mounting machine 20 and sliding along Y-axis guide rail 71. Y-axis slider 72 is connected to draw-out motor 73 via a ball screw mechanism (not shown). Draw-out device 70 drives draw-out motor 73 to pull component mounting machine 20 forward (in a direction orthogonal to the conveyance direction of board S) so as to overhang base 18. Draw-out motor 73 is driven by a control signal from mounting control device 29.

Management device 80 is a general-purpose computer, and as shown in FIG. 6, receives a signal from input device 82 operated by an operator, outputs an image signal to display 84, and outputs a drive signal to board conveyance device 62 that conveys board S. Management device 80 can output a sound signal to a speaker (not shown) or a lighting signal to a lamp (not shown). Production job data is stored in the memory of management device 80. In the production job data, in each of component mounting machines 20, which component is mounted on which board S in which order, how many boards S mounted in this manner are produced, and the like are determined. Management device 80 is communicably connected to mounting control device 29 by wire and communicably connected to loader control device 59 wirelessly, receives information on the mounting state of component mounting machine 20 from mounting control device 29, and receives information on the driving state of loader 50 from loader control device 59. In addition, management device 80 is also communicably connected to the respective control devices of printer 12, printing inspector 14, and the mounting inspector, and receives various types of information from the corresponding devices. Management device 80 determines whether a changeover occurs based on the stored production job data and the mounting status received from mounting control device 29 of each component mounting machine 20, and, when it is determined that a changeover has occurred, outputs information on the changeover to display 84, issues a notification to the operator of the occurrence of a changeover using a speaker or lamp, or sends a command of a changeover to loader control device 59. When receiving the mounting error as the mounting status from mounting control device 29, management device 80 outputs information on the mounting error to display 84, issues a notification to the operator of the occurrence of the mounting error using a speaker or a lamp, or sends the notification to loader control device 59. The mounting error may be, for example, the above-described pick-up error.

Management device 80 also controls feeder storage container 60. Management device 80 is communicably connected to feeder control device 39 of feeder 30 attached to feeder table 40 of feeder storage container 60 via connectors 35 and 45. Management device 80 stores storage information including the mounting position and identification information of feeder 30 stored in feeder storage container 60, the type of accommodated components, the component remaining number, and the like. Management device 80 updates the storage information to the latest information when feeder 30 is removed from feeder storage container 60 or when new feeder 30 is attached to feeder storage container 60.

The operation of component mounting system 10 configured as described above, in particular, the operation of loader 50 will be described. First, an automatic exchanging operation of feeder 30 using loader 50 will be described. Loader control device 59 receives the changeover command from management device 80, and removes feeder 30 accommodating components necessary for the next mounting operation from feeder storage container 60 to attach to each component mounting machine 20, or removes feeder 30 accommodating components unnecessary for the next mounting operation from each component mounting machine 20 to attach to feeder storage container 60. Loader control device 59 receives the component shortage information of feeder 30 attached to each component mounting machine 20 from each component mounting machine 20 via management device 80, removes feeder 30 from component mounting machine 20 and attaches it to feeder storage container 60, or removes feeder 30 accommodating the same type of components from feeder storage container 60 and attaches it to component mounting machine 20. Specifically, when feeder 30 is removed from feeder storage container 60 and attached to component mounting machine 20, loader control device 59 first causes X-axis motor 52a to move loader 50 to a position facing feeder storage container 60. Next, loader control device 59 causes clamp section 54 and Y-axis motor 55a to remove the necessary feeder 30 from the feeder storage container 60 and load it into loader 50. Subsequently, loader control device 59 causes X-axis motor 52a to move loader 50 to a position facing component mounting machine 20 to which feeder 30 is to be attached. Then, loader control device 59 causes clamp section 54 and Y-axis motor 55a to attach necessary feeder 30 to component mounting machine 20. When unnecessary feeder 30 is removed from component mounting machine 20 and attached to feeder storage container 60, loader control device 59 first causes X-axis motor 52a to move loader 50 to a position facing component mounting machine 20 to which unnecessary feeder 30 is attached. Next, loader control device 59 causes clamp section 54 and Y-axis motor 55a to remove unnecessary feeder 30 from component mounting machine 20 and load it into loader 50. Subsequently, loader control device 59 causes X-axis motor 52a to move loader 50 to a position facing feeder storage container 60. Then, loader control device 59 causes clamp section 54 and Y-axis motor 55a to attach unnecessary feeder 30 to feeder storage container 60.

When an operator is detected by right monitoring sensor 58R while loader 50 is moved rightward (in a direction from feeder storage container 60 toward component mounting machine 20), loader control device 59 stops the movement of loader 50 until the operator is not detected. When the operator is detected by left monitoring sensor 58L while loader 50 is moved leftward (in a direction from component mounting machine 20 toward feeder storage container 60), loader control device 59 stops the movement of loader 50 until the operator is not detected.

Figure 7:
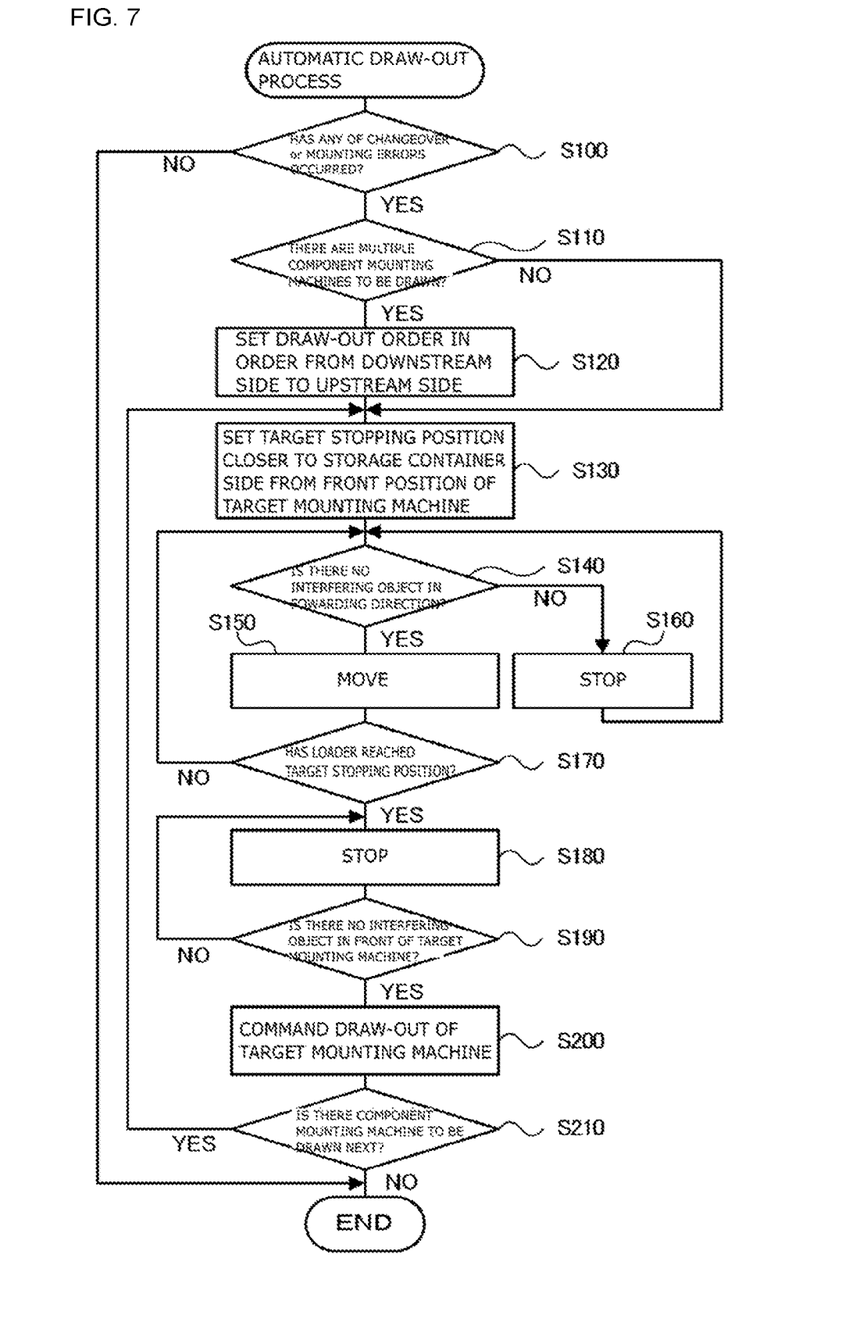
FIG. 7 is a flowchart showing an example of an automatic draw-out process.

Next, an operation of automatically drawing out component mounting machine 20 using loader 50 will be described. FIG. 7 is a flowchart showing an example of an automatic draw-out process executed by loader control device 59.

When the automatic draw-out process is executed, loader control device 59 first determines whether any of changeover and mounting errors has occurred (S100). The determination of the changeover is made based on whether the command of the changeover has been received from management device 80. The determination of the mounting error is performed based on whether the occurrence of the mounting error has been received from management device 80. When it is determined that neither the changeover nor the mounting error has occurred, loader control device 59 ends the automatic draw-out process as it is.

On the other hand, when loader control device 59 determines that either the changeover or the mounting error has occurred, loader control device 59 determines whether there are multiple component mounting machines 20 to be pulled forward (S110). If it is determined that there are multiple target mounting machines, loader control device 59 sets the draw-out order in the order from the downstream side to the upstream side in the conveyance direction of board S (S120) and proceeds to S130 process, and if it is determined that there is only one component mounting machine 20 to be pulled forward, loader control device 59 skips the S120 process and proceeds to the S130 process.

Next, loader control device 59 sets a target stopping position of loader 50 with component mounting machine 20 to be pulled forward this time as the target mounting machine (S130). Specifically, the target stopping position is a position closer to feeder storage container 60 side than a position facing the target mounting machine so as not to hit loader 50 when the target mounting machine is drawn, and a position at which the draw-out position of the target mounting machine is included in detection region AR of right monitoring sensor 58R. Loader control device 59 determines whether an interfering object (operator) has been detected in the advancing direction of loader 50 by monitoring sensor 58L or 58R (S140), and when it is determined that no interfering object has been detected, loader control device 59 causes X-axis motor 52a to move loader 50 toward the target stopping position (S150), and determines whether loader 50 has reached the target stopping position (S170). On the other hand, when it is determined that the interfering object has been detected, loader control device 59 stops moving loader 50 (S160) and returns to the S140 process. In this manner, loader control device 59 stops the movement of loader 50 when an interfering object (operator) is detected in the advancing direction of loader 50, and restarts the movement of loader 50 when the interfering object is not detected.

Figure 8:
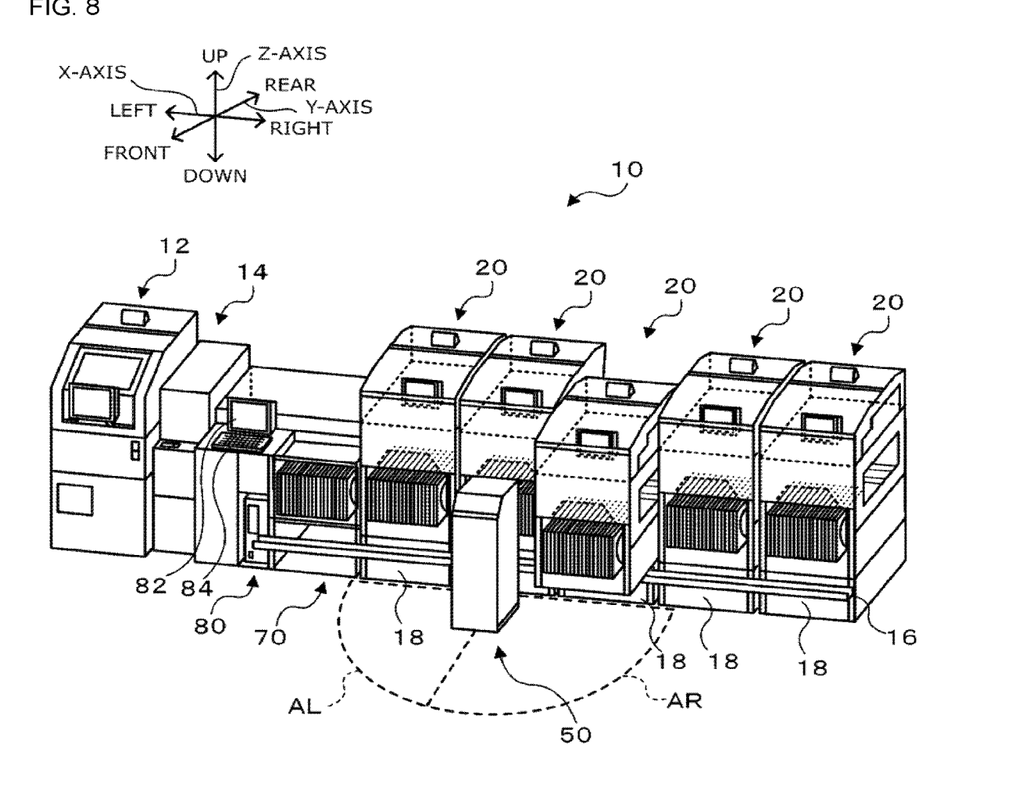
FIG. 8 is an explanatory diagram showing a state in which component mounting machine 20 is drawn out.

When it is determined that loader 50 has reached the target stopping position in the S170, loader control device 59 stops (S180) loader 50 and determines whether an interfering object (operator) has been detected in the draw-out position (front side) of the target mounting machine by right monitoring sensor 58R (S190). When it is determined that an interfering object has been detected in the draw-out position of the target mounting machine, loader control device 59 waits until the interfering object is no longer detected. As a result, it is possible to prevent the target mounting machine from hitting the interfering object when the target mounting machine is drawn. On the other hand, when it is determined that no interfering object has been detected in the draw-out position of the target mounting machine, loader control device 59 sends a draw-out command indicating the draw-out of the target mounting machine to management device 80 (S200). Upon receiving the draw-out command from loader control device 59, management device 80 sends the received draw-out command to mounting control device 29 of the target mounting machine. When receiving the draw-out command from management device 80, mounting control device 29 causes draw-out motor 73 to pull the target mounting machine forward, as shown in FIG. 8. As a result, the target mounting machine is in a draw-out state when the operator rushes to the site due to the occurrence of the changeover or the mounting error. Therefore, the operator can immediately start the work on the target mounting machine, and the waiting time for drawing out component mounting machine 20 can be shortened. When a changeover occurs, the work performed by the operator on the target mounting machine may include, for example, a work of exchanging head 24 with a piece suitable for the next mounting operation, a work of replacing nozzle station 28 with a piece accommodating a suction nozzle suitable for the next mounting operation, or the like. Further, when a mounting error (pick-up error) occurs, the work performed by the operator on the target mounting machine may include, for example, the work of removing a component dropped due to the pick-up error.

When loader control device 59 transmits the draw-out command of the target mounting machine, it determines whether there is component mounting machine 20 to be pulled forward next (S210), and when it determines that there is component mounting machine 20 to be pulled forward next, the procedure returns to the S130, and repeats the S130 to S200 processes with next component mounting machine 20 as the target mounting machine in accordance with the draw-out order set in the S120. When there are multiple component mounting machines 20 to be pulled forward, the draw-out order is determined from the downstream to the upstream. In addition, loader control device 59 stops loader 50 at a position closer to feeder storage container 60 side than the position facing the target mounting machine so as not to hit the target mounting machine when the target mounting machine is drawn, and determines whether an interfering object is detected at the draw-out position of the target mounting machine by right monitoring sensor 58R. Therefore, loader control device 59 can sequentially draw out multiple component mounting machines 20 while sequentially moving loader 50 from the downstream to the upstream and checking that there is no interfering object at the draw-out position of component mounting machine 20. When it is determined that there is no component mounting machine 20 to be pulled forward in the S210, loader control device 59 ends the automatic draw-out process.

Here, the correspondence relationship between the main elements of the embodiments and the main elements of the present disclosure described in the section of the disclosure of the disclosure will be described. That is, component mounting system 10 corresponds to a work system, component mounting machine 20 corresponds to a work device, monitoring sensors 58L and 58R correspond to sensors, loader 50 corresponds to a replenishing device, and draw-out device 70 corresponds to a draw-out device. Feeder storage container 60 corresponds to a member storage container.

In the work system of the embodiment described above, by executing the automatic draw-out process, component mounting machine 20 can be drawn before the operator arrives at the site or immediately after the operator arrives at the site. As a result, the operator can immediately start the necessary work on drawn component mounting machine 20, and the waiting time can be shortened. In addition, since loader 50 checks whether there is an interfering object (operator) at the draw-out position of component mounting machine 20 prior to the draw-out of component mounting machine 20, it is possible to sufficiently secure safety. Further, since the presence or absence of an interfering object at the draw-out position of component mounting machine 20 is checked by using monitoring sensor 58R provided in loader 50 for replenishing feeder 30 necessary for component mounting machine 20, it is unnecessary to provide a dedicated sensor.

In addition, loader 50 checks whether there is an interfering object at the draw-out position of the target mounting machine at a position closer to feeder storage container 60 side than the position facing the target mounting machine. Therefore, even after the target mounting machine is drawn, loader 50 moves to a position facing feeder storage container 60, and can attach feeder 30 to feeder storage container 60 or remove feeder 30 from feeder storage container 60.

Further, when there are multiple component mounting machines 20 to be pulled forward, the draw-out order is determined in the order from the downstream to the upstream in the conveyance direction of board S. As a result, loader control device 59 can sequentially draw out multiple component mounting machines 20 while sequentially moving loader 50 from the downstream to the upstream and checking that there is no interfering object at the draw-out position of component mounting machine 20.

The present disclosure is not limited to the above-mentioned embodiments, and it is needless to say that the present disclosure can be implemented in various modes as long as it belongs to the technical scope of the disclosure of the present disclosure.

For example, in the embodiment described above, feeder storage container 60 is provided on the upstream side of component mounting machine 20 which is the most upstream of multiple component mounting machines 20. However, feeder storage container 60 may be provided on the downstream side of component mounting machine 20 which is the most downstream of multiple component mounting machines 20. Of course, feeder storage container 60 may be incorporated at any other position on the production line. Further, feeder storage container 60 is not limited to one, and multiple feeder storage containers may be provided.

In the embodiment described above, when there are multiple component mounting machines 20 to be pulled forward, the draw-out order of is determined in the order from the downstream to the upstream in the board conveyance direction. However, the draw-out order may be determined in the order from the upstream (left) to the downstream (right) in the board conveyance direction. In this case, loader control device 59 may stop loader 50 at a position closer to the downstream (right) side in the board conveyance direction than the draw-out position of the target mounting machine, and determine whether an interfering object is detected at the draw-out position of the target mounting machine by left monitoring sensor 58L. However, it is desirable that the draw-out order be from the far side to the near side from feeder storage container 60 so that loader 50 can be moved to feeder storage container 60 even after component mounting machine 20 is drawn.

In the embodiment described above, component mounting system 10 is configured such that all of multiple component mounting machines 20 are movable in the direction (forward) orthogonal to the conveyance direction of board S. However, at least one of multiple component mounting machines 20 may be movable in a direction orthogonal to the conveyance direction of board S.

In the embodiment described above, loader control device 59 can communicate with mounting control device 29 of each component mounting machine 20 via management device 80. However, loader control device 59 may be capable of directly communicating with mounting control device 29 of each component mounting machine 20.

In the embodiment described above, the work system is applied to component mounting system 10, but can be applied to any work system as long as it includes multiple work devices aligned along the board conveyance line and performs a predetermined work on a board conveyed along the board conveyance line.

INDUSTRIAL APPLICABILITY

The present disclosure can be applied to a manufacturing industry of a work system and the like.

REFERENCE SIGNS LIST 10 component mounting system; 12 printer; 14 printing inspector; 16 X-axis rail; 18 base; 20 component mounting machine; 22 housing; 23 board conveyance device; 24 head; 25 head moving mechanism; 26 mark camera; 27 part camera; 28 nozzle station; 29 mounting control device; 30 feeder; 32 tape reel; 33 tape feeding mechanism; 34 positioning pin; 35 connector; 37 rail member; 39 feeder control device; 40 feeder table; 42 slot; 44 positioning hole; 45 connector; 50 loader; 51 loader moving mechanism; 52a X-axis motor; 52b guide roller; 53 feeder transfer mechanism; 54 clamp section; 55a Y-axis motor; 55b Y-axis guide rail; 57 encoder; 58L, 58R, monitoring sensor; 59 loader control device; 60 feeder storage container; 62 board conveyance device; 70 draw-out device; 71 Y-axis guide rail; 72 Y-axis slider; 73 draw-out motor; 80 management device; 82 input device; 84 display; S board; AL, AR detection region

The invention claimed is:

1. A work system for performing a predetermined work on a board conveyed along a board conveyance line, the work system comprising:
   multiple work devices aligned along the board conveyance line, each of the work devices including a feeder that stores components and includes a mounter that mounts the components on the board;
   a replenishing device configured to move in parallel with the board conveyance line, to replenish the components of the feeder of the multiple work devices, the replenishing device including a sensor configured to detect presence or absence of an interfering object outside of the multiple work devices; and
   a draw-out device configured to draw out a work device of the multiple work devices in a direction orthogonal to a direction along the board conveyance line,
   wherein, when a draw-out request for the work device is made, the replenishing device performs an automatic draw-out process of moving to a position, in which a draw-out position of the work device to be drawn out is included within a detection range of the sensor, so as to detect whether the interfering object interferes with the work device being drawn out, and directly or indirectly outputting a signal to the draw-out device so that the work device to be drawn out is drawn when the interfering object is not detected.

2. The work system according to claim 1, the work system further comprising:
   a member storage container, being provided at a most upstream or a most downstream on the board conveyance line, which stores a member including the components to be replenished by the replenishing device,
   wherein, when the draw-out request for the work device is made, the replenishing device moves to a position which is closer to a side of the member storage container from the draw-out position of the work device to be drawn out within the detection range of the sensor, including the draw-out position of the work device to be drawn out, so as to determine whether the interfering object is detected by the sensor.

3. The work system according to claim 1,
   wherein, when there are multiple work devices to be drawn out, the replenishing device executes the automatic draw-out process for each of the work devices to be drawn out while moving in one direction from an upstream side to a downstream side or from the downstream side to the upstream side on the board conveyance line.

4. The work system according to claim 1,
   wherein the draw-out request is made based on an occurrence of a changeover or an occurrence of an error in any of the multiple work devices.

5. The work system according to claim 1,
   wherein the draw-out device includes guide rails extending in the direction orthogonal to the direction along the board conveyance line and includes a slider that slides the work machine along the guide rails.

* * * * *